United States Patent
Werner et al.

(10) Patent No.: US 10,743,666 B2
(45) Date of Patent: Aug. 18, 2020

(54) SELF-ACTING DEVICE FOR FACILITATING PREVENTING PRODUCT TIP OVER

(71) Applicant: INTERNATIONAL BUSINESS MACHINES CORPORATION, Armonk, NY (US)

(72) Inventors: John S. Werner, Fishkill, NY (US); Arkadiy O. Tsfasman, Wappingers Falls, NY (US); Budy D. Notohardjono, Poughkeepsie, NY (US); Nicholas G. Danyluk, Long Island City, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 82 days.

(21) Appl. No.: 16/137,686

(22) Filed: Sep. 21, 2018

(65) Prior Publication Data
US 2020/0093267 A1  Mar. 26, 2020

(51) Int. Cl.
*A47B 97/00* (2006.01)
*A47B 91/00* (2006.01)
(Continued)

(52) U.S. Cl.
CPC ............ *A47B 97/00* (2013.01); *A47B 91/005* (2013.01); *A47B 91/02* (2013.01);
(Continued)

(58) Field of Classification Search
CPC ........... A47B 2097/008; H05K 5/0234; H05K 7/1495; A47L 15/427; F24C 15/083
See application file for complete search history.

(56) References Cited

U.S. PATENT DOCUMENTS

| | | | |
|---|---|---|---|
| 2,854,785 A * | 10/1958 | Sperlich | A47B 97/00 248/188.1 |
| 3,262,582 A | 7/1966 | Pittman et al. | |

(Continued)

FOREIGN PATENT DOCUMENTS

| | | |
|---|---|---|
| CA | 2 785 111 A1 | 2/2013 |
| CN | 204979459 U | 1/2016 |

(Continued)

OTHER PUBLICATIONS

IBM Publication, "Apparatus for Improved Rack System Stability and Mobility", IPCOM000153410D, published May 31, 2007 (2 pages).

(Continued)

*Primary Examiner* — Bradley Duckworth
(74) *Attorney, Agent, or Firm* — Tihon Poltavets, Esq.; Kevin P. Radigan, Esq.; Heslin Rothenberg Farley & Mesiti P.C.

(57) ABSTRACT

Self-acting devices and methods are provided for facilitating preventing product tip over. The self-acting device includes an anti-tip mechanism associated with a product to facilitate preventing tip over of the product when in an extended state. Further, the device includes an actuator associated with the product. The actuator is operatively coupled to facilitate transition of the anti-tip mechanism from a retracted state to the extended state. Further, an actuator control is provided to signal the actuator to facilitate transitioning the anti-tip mechanism from the retracted state to the extended state based on the actuator control detecting movement of the product across a floor.

19 Claims, 13 Drawing Sheets

(51) Int. Cl.
*A47B 91/02* (2006.01)
*H05K 5/02* (2006.01)
*H05K 7/14* (2006.01)

(52) U.S. Cl.
CPC ...... *A47B 2097/008* (2013.01); *H05K 5/0234* (2013.01); *H05K 7/1488* (2013.01)

(56) References Cited

U.S. PATENT DOCUMENTS

| | | | |
|---|---|---|---|
| 3,877,727 A | 4/1975 | Johannser | |
| 4,179,633 A | 12/1979 | Kelly | |
| 4,441,770 A * | 4/1984 | Brezosky | A47L 15/427 312/271 |
| 4,836,624 A | 6/1989 | Schwickrath | |
| 5,007,522 A | 4/1991 | Focke et al. | |
| 5,180,060 A | 1/1993 | Forti et al. | |
| 5,351,829 A | 10/1994 | Batsford | |
| 5,585,560 A * | 12/1996 | Goossens | G01P 1/026 324/166 |
| 5,931,499 A * | 8/1999 | Sutherland | B60R 21/00 180/282 |
| 6,394,738 B1 * | 5/2002 | Springer | B62D 49/08 187/232 |
| 6,636,418 B1 * | 10/2003 | Claprood | G06F 1/181 248/188.4 |
| 6,857,711 B1 | 2/2005 | Straus | |
| 7,549,664 B2 | 6/2009 | Bozung et al. | |
| 7,775,498 B2 * | 8/2010 | Phillips | A47L 15/4253 248/500 |
| 9,422,083 B1 * | 8/2016 | Embleton | B65D 19/38 |
| 9,505,555 B2 | 11/2016 | Glickman et al. | |
| 9,532,650 B2 | 1/2017 | Barnett | |
| 9,743,543 B2 * | 8/2017 | Anderson | H05K 5/0234 |
| 9,758,277 B2 * | 9/2017 | Embleton | B65D 19/38 |
| 9,861,194 B1 * | 1/2018 | Park | A47B 97/00 |
| 10,452,080 B1 * | 10/2019 | Coq | H05K 7/1488 |
| 2010/0162835 A1 | 7/2010 | Lee et al. | |
| 2017/0034935 A1 | 2/2017 | Anderson et al. | |
| 2017/0273212 A1 | 9/2017 | Davis et al. | |
| 2019/0082837 A1 * | 3/2019 | Kim | E05B 65/463 |
| 2019/0276183 A1 * | 9/2019 | Coq | B65D 19/02 |
| 2019/0364675 A1 * | 11/2019 | Lee | H05K 5/0204 |

FOREIGN PATENT DOCUMENTS

| | | |
|---|---|---|
| CN | 206043997 U | 3/2017 |
| DE | 10-2004028053 A1 | 12/2005 |
| EP | 1 985 576 A2 | 10/2008 |
| GB | 1 395 016 | 11/1972 |
| JP | H09-095219 A | 4/1997 |
| WO | WO 2004/091265 A2 | 10/2004 |
| WO | WO 2017/141563 A1 | 8/2017 |

OTHER PUBLICATIONS

IBM Publication, "Low Profile Handling Rails with Emergency Stability Feature for High End Server Shipments" IPCOM000192883D, published Feb. 5, 2010 (2 pages).

IBM Publication, "Rack Stability Deployment System", IPCOM000224955D, published Jan. 15, 2013 (2 pages).

Coq et al., "Tip-Over Prevention Apparatus," U.S. Appl. No. 15/915,873, filed Mar. 8, 2018 (19 pages).

Coq et al., "Self-Actuating Device for Facilitating Preventing Product Tip Over", U.S. Appl. No. 15/984,602, filed May 21, 2018 (37 pages).

* cited by examiner

SELF-ACTING DEVICE FOR FACILITATING PREVENTING PRODUCT TIP OVER

BACKGROUND

A computer rack, or machine, or more generally a product, can be susceptible to a tip over incident during movement across a floor. Depending on the configuration, a product could be heavy with a relatively high center of gravity, making the product more susceptible to tip over, with any tip over potentially causing bodily injury, as well as product damage. There are various events which could require product movement, thus raising the potential for product tip over. For instance, a data center could be undergoing reconfiguration, or could be receiving one or more new computer racks, or one or more computer racks could be in the process of being moved as part of the shipping or transport, etc.

SUMMARY

Certain shortcomings of the prior art are overcome and additional advantages are provided through the provision, in one or more aspects, of a device for preventing product tip over. The device includes an anti-tip mechanism, an actuator, and an actuator control. The anti-tip mechanism is associated with a product to facilitate preventing tip over of the product when in an extended state, and the actuator is operatively coupled to transition the anti-tip mechanism from a retracted state to the extended state. The actuator control signals the actuator to facilitate transition of the anti-tip mechanism from the retracted state to the extended state based on the actuator control detecting movement of the product across a floor.

In another aspect, a device for preventing product tip over is provided. The device includes an anti-tip mechanism, an actuator, and an actuator control. The anti-tip mechanism is associated with a product to facilitate preventing tip over of the product when in an extended state, and includes at least one outwardly-biased outrigger. The actuator is associated with the product and is operatively coupled to transition the anti-tip mechanism from the retracted state to the extended state. The actuator control signals the actuator to facilitate transitioning the anti-tip mechanism from the retracted state to the extended state based on the actuator control detecting movement of the product across the floor. The signal is based on the actuator control detecting rotation of a caster of multiple casters upon which the product rests.

In a further aspect, a method of facilitating preventing product tip over is provided. The method includes coupling an anti-tip mechanism to a product to facilitate preventing tip over of the product, the anti-tip mechanism having a retracted state and an extended state, and associating an actuator with the product and operatively coupling the actuator to the anti-tip mechanism to control transitioning the anti-tip mechanism from the retracted state to the extended state. Further, the method includes providing an actuator control to signal the actuator to facilitate transitioning the anti-tip mechanism from the retracted state to the extended state based on the actuator control detecting movement of the product across the floor.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description in this specific example(s), while indicating aspects of the invention, is given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application to facilitate, for instance, providing a self-acting device to resist product tip over.

The illustrative embodiments may be described below using specific designs, architectures, protocols, layouts, schematics, or tools only as examples, and are not limited to the illustrative embodiments. The illustrative embodiments may be used in conjunction with other comparable or similarly purposed structures, systems, applications, or architectures.

The examples in this disclosure are used only for clarity of description and are not limiting to the illustrative embodiments. Additional operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed herein.

Note that the term product is used herein to refer generally to any product, package, apparatus, machine, container, cabinet, rack, pallet, etc., that may benefit from having a tip over preventing device, such as disclosed herein. As one example, the product can be a computer rack, which conventionally is of high value, relatively tall, and potentially top heavy, and therefore prone to tipping during transport or other movement, such as when being moved within a data center. Further, computer racks are becoming taller, with racks up to 46 U now being produced, resulting in a greater risk of tip over when being moved.

Figure 1A:
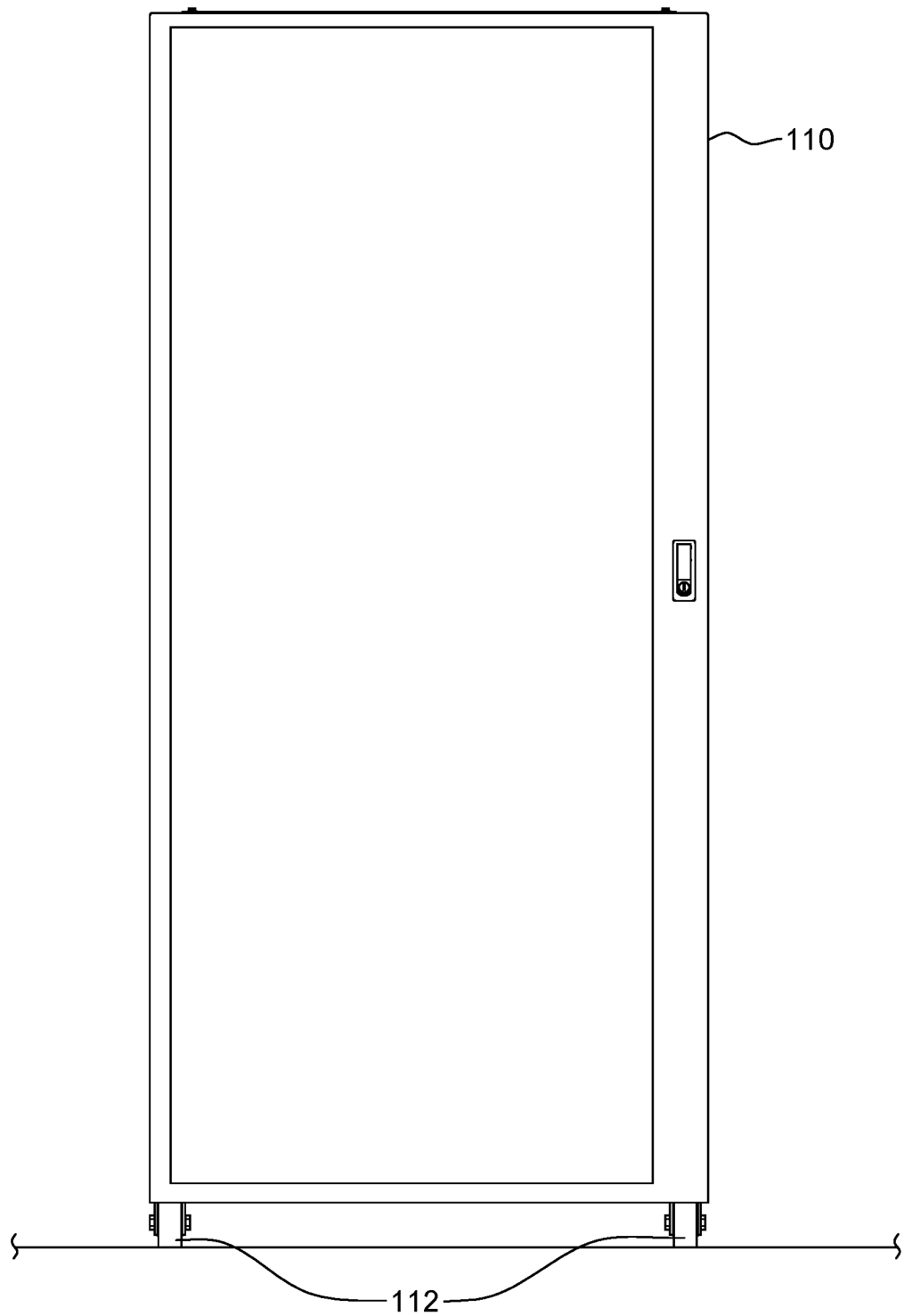
FIG. 1A depicts one embodiment of a product susceptible to tip over, and which can benefit from a device, in accordance with one or more aspects of the present invention.
Figure 1B:
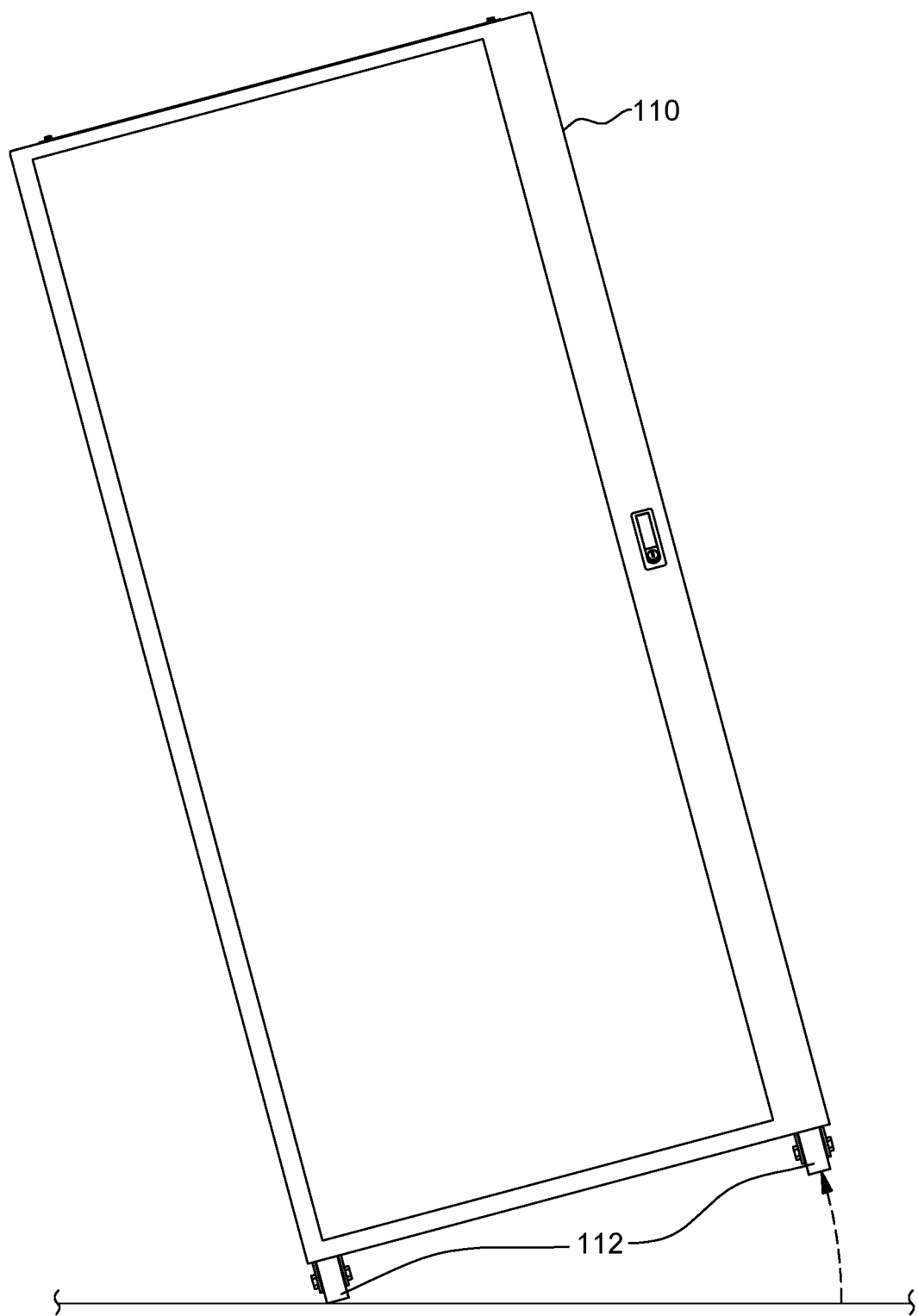
FIG. 1B depicts the product embodiment of FIG. 1A in the process of tipping over, shown without benefit of a device, in accordance with one or more aspects of the present invention.

As an example, FIG. 1A depicts one embodiment of a product 110 representative of any product, package, apparatus, machine, container, cabinet, rack, pallet, or other structure, etc., that can benefit from having a tip-over-preventing device. By way of example, product 110 is referred to herein as being a computer rack (such as an IT rack), which as noted above, can be relatively tall and potentially top-heavy, depending on the arrangement of components within the rack. As shown, product 110 can be supported by multiple casters 112 or small wheels, which can be free to swivel in any direction so that the product can be moved across a floor (such as the raised floor of a raised floor data center). FIG. 1B depicts an example of tip over of product 110, where product 110 is shown tilted and in the process of tipping over as a result of, for instance, improper movement of the product.

As one possible solution, a product, such as a computer rack, can be equipped with manually actuated outriggers to enhance safety and stability when moving the product. For instance, outriggers with auxiliary casters could be provided beneath the product and manually extended prior to moving the product in order to provide stability when being moved. This approach, however, requires action by the mover, which may not always be performed prior to moving the product.

Disclosed herein, therefore, are self-acting devices and methods for preventing product tip over. The self-acting device includes an anti-tip mechanism associated with the product to facilitate preventing tip over of the product when in an extended state, and an actuator associated with the product. The actuator is operatively coupled to control transition the anti-tip mechanism from a retracted state to the extended state. Further, the device includes an actuator control to signal the actuator to facilitate transitioning the anti-tip mechanism from the retracted state to the extended state based on the actuator control detecting movement of the product across the floor.

Figure 2A:
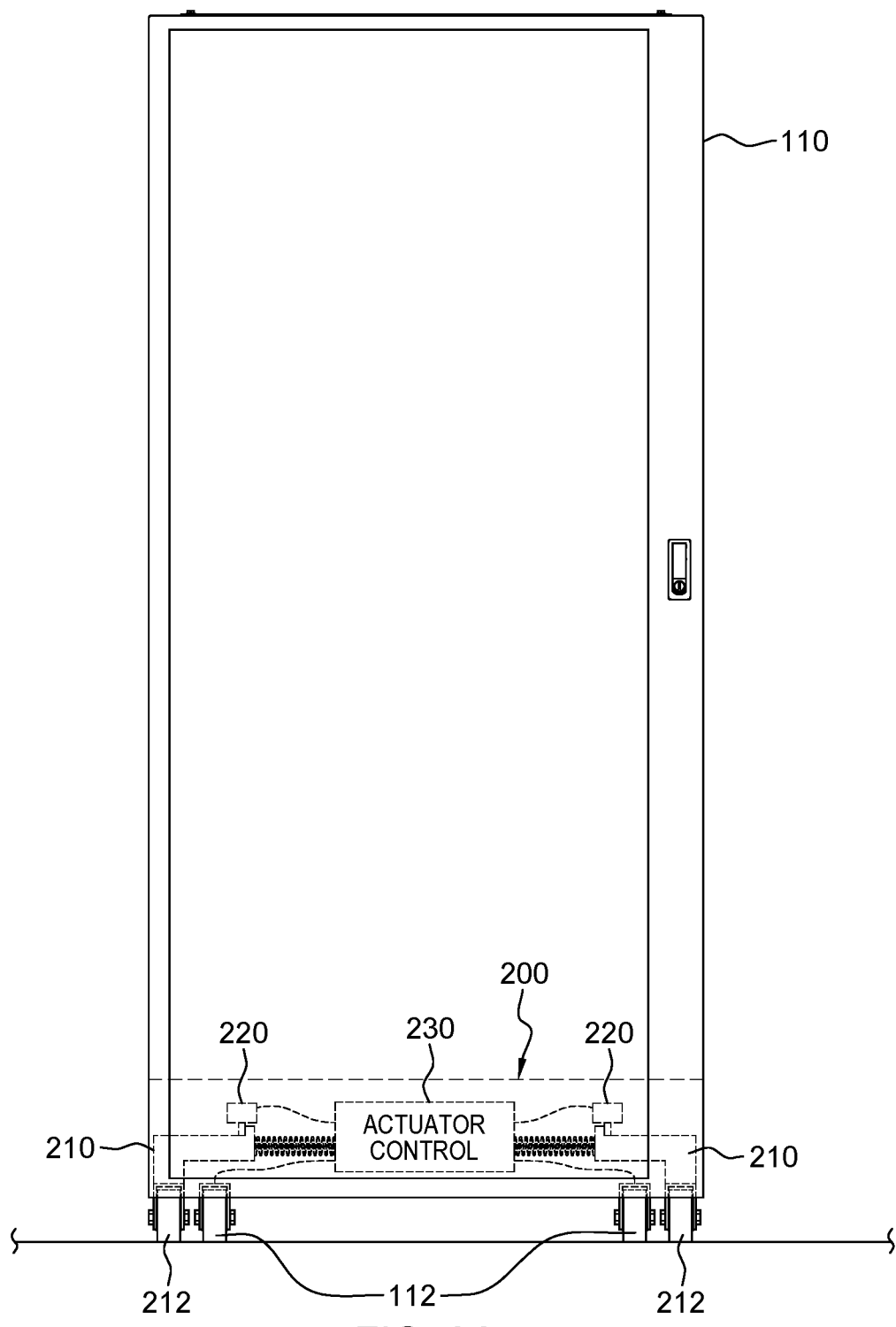
FIG. 2A depicts one embodiment of a product with a self-acting, anti-tip device for preventing product tip over, and illustrating the anti-tip mechanism(s) thereof in a retracted state, in accordance with one or more aspects of the present invention.
Figure 2B:
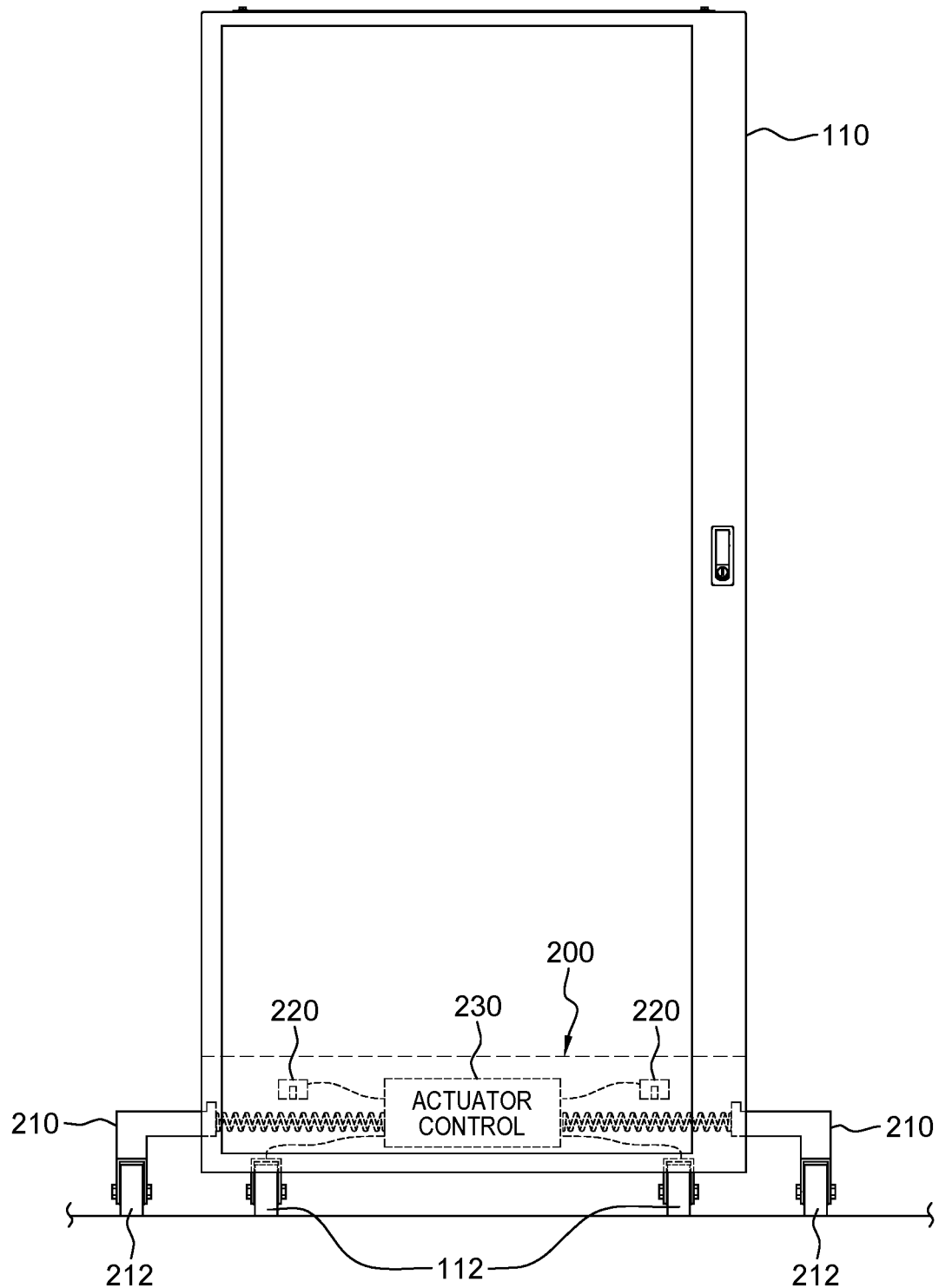
FIG. 2B depicts the product and device assembly of FIG. 2A, with the anti-tip mechanism(s) shown in an extended state, in accordance with one or more aspects of the present invention.

FIGS. 2A & 2B depict one embodiment of a device 200, in accordance with one or more aspects of the invention. In the embodiment depicted, device 200 is a self-acting device associated with product 110, being disposed, by way of example, in a lower portion of the product. Device 200 includes, in one or more embodiments, one or more anti-tip mechanisms 210, such as outwardly-biased (or spring-biased) outriggers, each of which has associated therewith (in one or more embodiments) an auxiliary caster 212. Further, device 200 includes one or more actuators 220, such as solenoid actuators, operatively positioned to retain anti-tip mechanisms 210 in the retracted position of FIG. 2A until engaged by an actuator control 230. In one or more implementations, actuator control 230 signals the one or more actuators 220 to facilitate transition of the anti-tip mechanisms 210 to the extended state based on the actuator control detecting movement of the product across a floor. For instance, one or more motion sensors can be provided for sensing movement of product 110 across the floor.

In one or more embodiments, actuator control 230 can include, or utilize, one or more permanent magnets coupled to rotate with one or more casters 112 supporting product 110. Further, actuator control 230 can include an inductive coil fixedly positioned outside the caster such that rotation of the caster with one or more permanent magnets induces an electromotive force on the inductive coil to generate a voltage. The generated voltage then causes the actuator control to signal the actuator to facilitate transitioning the anti-tip mechanism from the retracted state to the extended state shown in FIG. 2B.

Figure 3A:
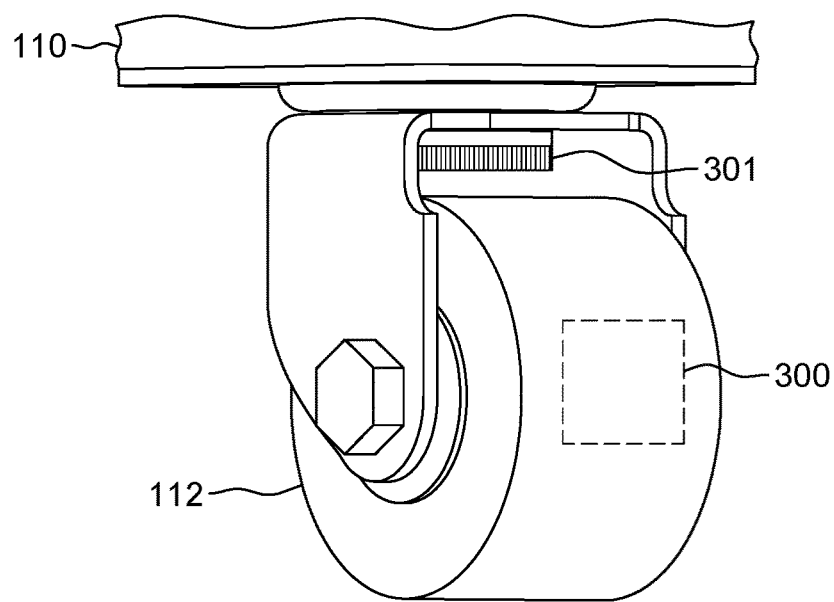
FIG. 3A depicts one embodiment of a product-supporting caster and a portion of an actuator control of a self-acting, anti-tip device, where a permanent magnet is coupled to rotate with the caster, in accordance with one or more aspects of the present invention.
Figure 3B:
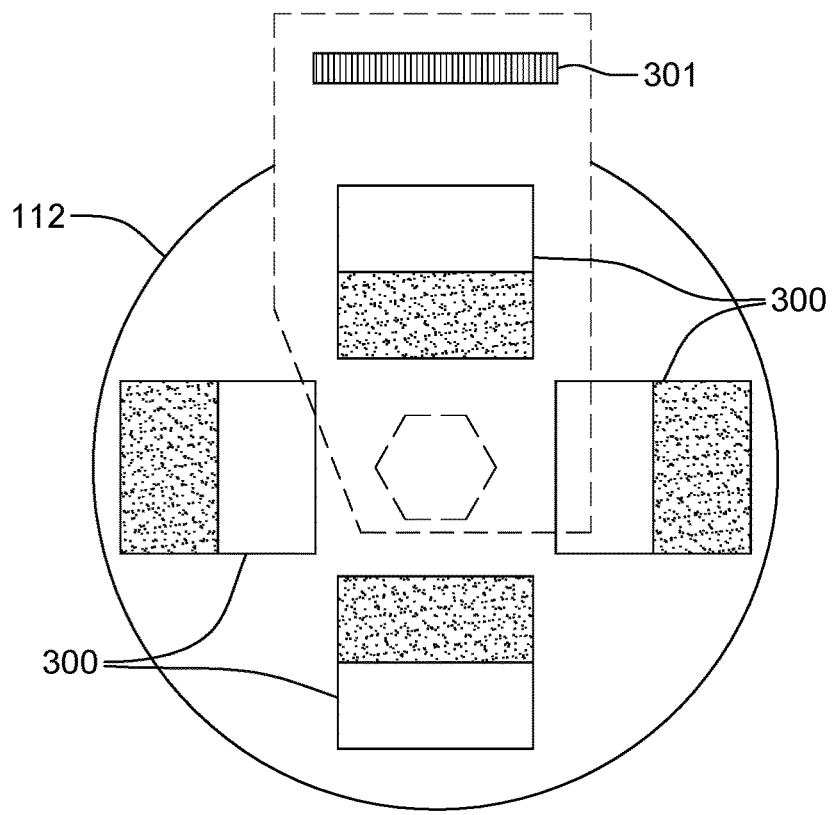
FIG. 3B depicts another embodiment of a product-supporting caster and a portion of an actuator control of a self-acting, anti-tip device, in accordance with one or more aspects of the present invention.
Figure 3C:
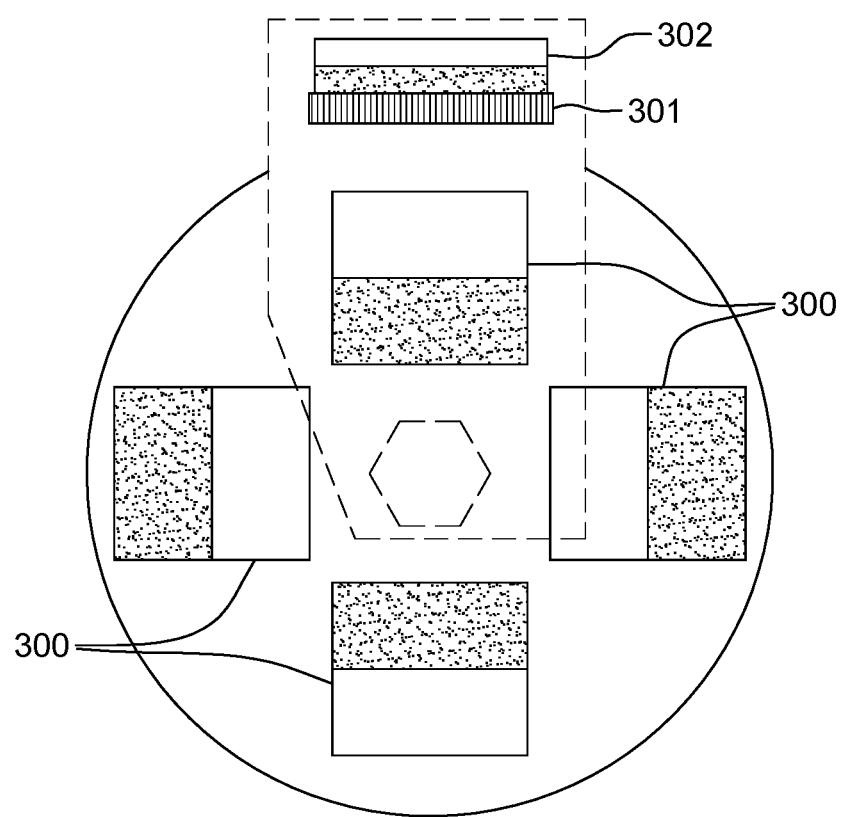
FIG. 3C shows a further embodiment of a product-supporting caster and a portion of an actuator control of a self-acting, anti-tip device, in accordance with one or more aspects of the present invention.

FIGS. 3A-3C depict various embodiments of a product-supporting caster 112 with one or more permanent magnets 300, 302, and an inductive coil 301 associated therewith for generating a voltage due to, and representative of, movement of the product.

As one embodiment, FIG. 3A depicts a caster 112 with a permanent magnet 300 coupled to caster 112 to rotate with the caster with movement of the product 110 across a floor. Permanent magnet 300 can be embedded within caster 112 or, optionally, attached to a side of the caster, or otherwise affixed to the caster to rotate with the caster as the product 110 is moved across the floor. Inductive coil 301 can be, or include, any inductive wire coil positioned so that the permanent magnet(s) coupled to or built into caster 112 induces an electromotive force (EMF) on the coil. One or more electrically conductive lines couple the inductive coils 301 to an actuator control circuit, various embodiments of which are described below with reference to FIGS. 5A-6.

FIG. 3B depicts an alternate arrangement wherein multiple (for instance, four) permanent magnets 300 are coupled to rotate with caster 112. To facilitate inducing of the electromotive force on the inductive coil, adjacent permanent magnets 300 of the multiple permanent magnets coupled to rotate with caster 112 are oriented with opposite outward-facing polarities, such that as caster 112 rotates, the outer polarities of the permanent magnets vary. As noted, if desired, permanent magnets 300 could be configured for and positioned on one or more sides of the caster(s) to rotate with the caster. A side-mounted embodiment could be employed where structural integrity of the casters needs to be maintained, for instance, due to weight of the product.

In FIG. 3C permanent magnets 300 are a set of first permanent magnets (coupled to rotate with the caster), and the actuator control includes a set of one or more second permanent magnets 302, which are affixed in close proximity to caster 112, but positioned so as not to rotate with the caster. In the embodiment of FIG. 3C, inductive coil 301 is located such that the inductive loops of the coil reside between the set of second permanent magnet(s) 302 and rotating set of first permanent magnet(s) 300 coupled to caster 112. Note also that in one or more embodiments, the inductive coil could be variously configured. For instance, the coil could be configured and located to extend at least partially around the caster, outside the caster. In one embodiment, brush contacts could be utilized for the inductive coil for a caster or swivel wheel.

As will be understood by those skilled in the art, Faraday's law of induction is a basic law of electromagnetism that predicts how a magnetic field will interact with an electric circuit to produce an electromotive force (EMF). Electromagnetic induction is the production of an EMF (i.e., voltage across an electrical conductor, referred to herein as the inductive coil) due to its dynamic interaction with a magnetic field. As the casters or wheels rotate, a changing magnetic flux will be created due to the positioning and configuration of the permanent magnet(s) (such as the first permanent magnets coupled to the caster, and the second permanent magnet fixed in close proximity to the caster in FIG. 3C). The changing magnetic flux induces an EMF on the coil, and portions of the coil that are parallel to the magnetic flux will generate a greatest amount of EMF. As explained further below, the EMF can be transferred directly to an actuator, such as a solenoid actuator, to signal the actuator to facilitate transitioning the anti-tip mechanism. For instance, many solenoid actuators can operate with 0.5 W of power, or even significantly less power.

As an alternative to powering a solenoid actuator directly, an energy storage component, such as a battery or capacitor, could be used to store the EMF induced on the coil by the permanent magnets if additional power is desired to engage the actuator. The energy storage component can power a control circuit that engages the actuator and/or adjusts timing of the actuator engagement. The actuator, when not engaged, is provided to retain the outwardly-biased outrigger in the retracted state, that is, in the compressed, non-extended state. In one or more embodiments, when the actuator engages, the outwardly-biased outriggers are allowed to extend to their full, relaxed position, which places the outriggers in the extended state, and facilitates safe product movement.

Figure 4:
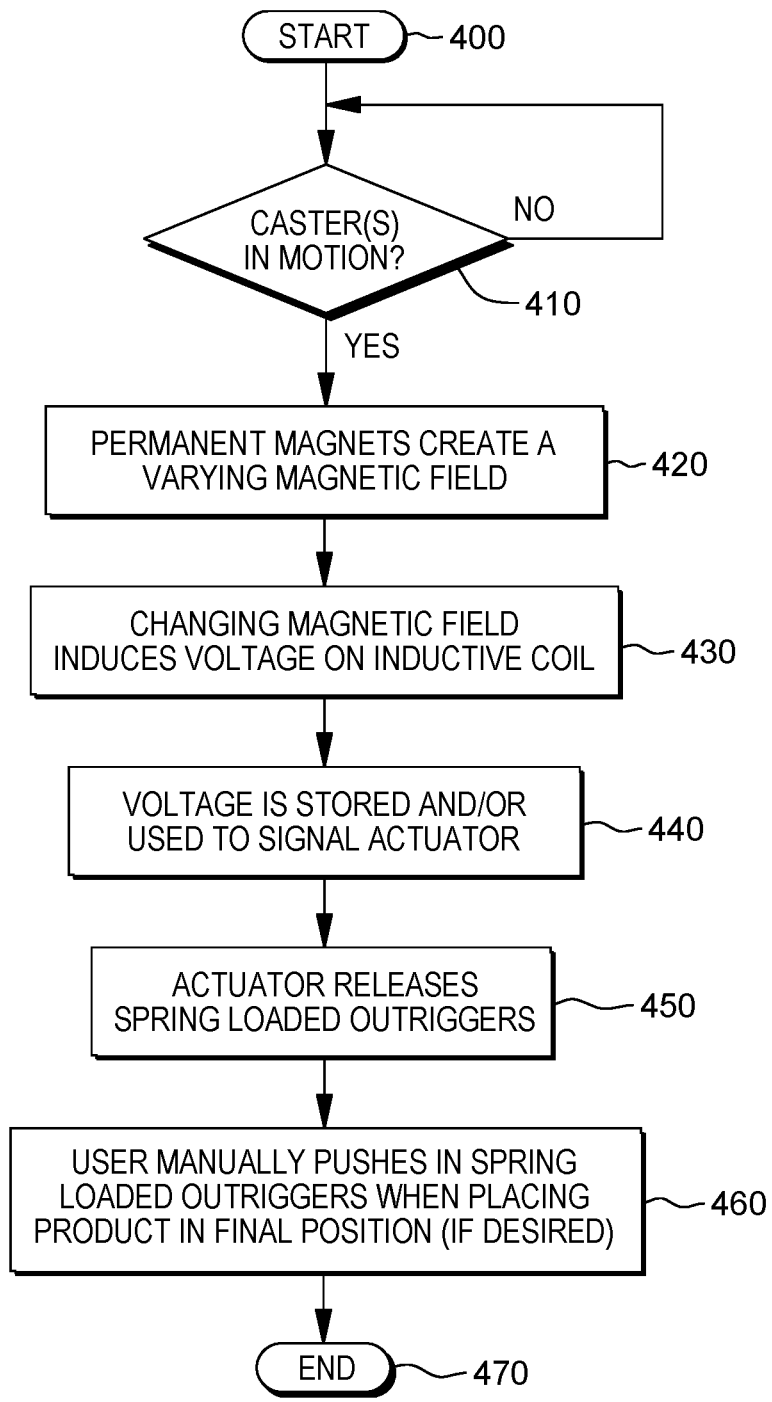
FIG. 4 depicts one embodiment of a process of transitioning an anti-tip mechanism of a self-acting, anti-tip device from retracted state to extended state, in accordance with one or more aspects of the present invention.

FIG. 4 depicts one embodiment of an actuator control process which assumes that the anti-tip mechanisms are, or include, outwardly-biased outriggers, and that the outriggers are in the retracted, compressed state depicted, for instance, in FIG. 2A. As depicted in FIG. 4, the control process starts 400 with detecting that the product casters are in motion 410. As noted, in one or more embodiments, magnets coupled to one or more casters can be used to generate a varying magnetic field 420, and this changing magnetic field induces a voltage on one or more inductive coils 430. For instance, in one embodiment, multiple casters could each have one or more associated permanent magnets and one or more adjacent inductive coils for inducting voltage. As noted, the voltage can be stored, or used directly, to signal the actuator to facilitate transition of the anti-tip mechanism(s) from a retracted state to extended state 440. In one or more embodiments, the actuator can include a solenoid actuator or pin, and the voltage can be used to signal the solenoid pin to retract, allowing outwardly-biased outriggers to transition to the extended state. In particular, engaging the actuator releases the spring-loaded outrigger(s) 450, which results in the anti-tip mechanisms transitioning to the extended state, as depicted, for instance, in FIG. 2B. Once the product has been moved into a final position, a user can manually push the spring-loaded outriggers back into the retracted state or position, placing the outriggers in their final position during operation of the product 460, which completes the actuator control process 470.

In one or more embodiments, the anti-tip mechanisms, or outriggers, can be designed with rounded edges to minimize any chance of catching on nearby objects, either within the product or outside the product. This can also facilitate manually retracting the outriggers since they are spring-loaded. As noted, depending on the implementation, it can be desirable to place the permanent magnets for rotation on one or more sides of a caster rather than within the caster itself, which might otherwise compromise performance of the caster. Further, in one or more embodiments, the permanent magnets could be placed on a separate structure that rotates with the caster, or with movement of the product. In such an implementation, the inductive coil and, if present, the one or more fixedly positioned permanent magnets, would be located in close proximity to the separate structure. If desired, the permanent magnets to rotate could even be coupled to the auxiliary casters of the anti-tip mechanisms, in one or more embodiments, or to other wheel-type structures associated with the product.

Further, in one or more implementations, an optional override switch could be implemented to selectively disconnect the actuator (for instance, a solenoid actuator or pin) from the actuator control, such as the energy storage component of the control. The override switch could be provided as, for instance, a push button switch, so that it could not be left in the open position accidently, which would inadvertently deactivate the outriggers. An optional override switch might be utilized to allow a mover the option to prevent the outriggers from extending outward automatically if the product is in close proximity to other objects. For instance, a user may need to place a product such as a server rack between other server racks, and an override switch would allow the user to move the product the final few feet into position without the outriggers automatically extending out. Also, a user may need to maneuver the product around tight corners or through narrow openings, for which automatic extension of the anti-tip mechanisms would be problematic.

Figure 5A:
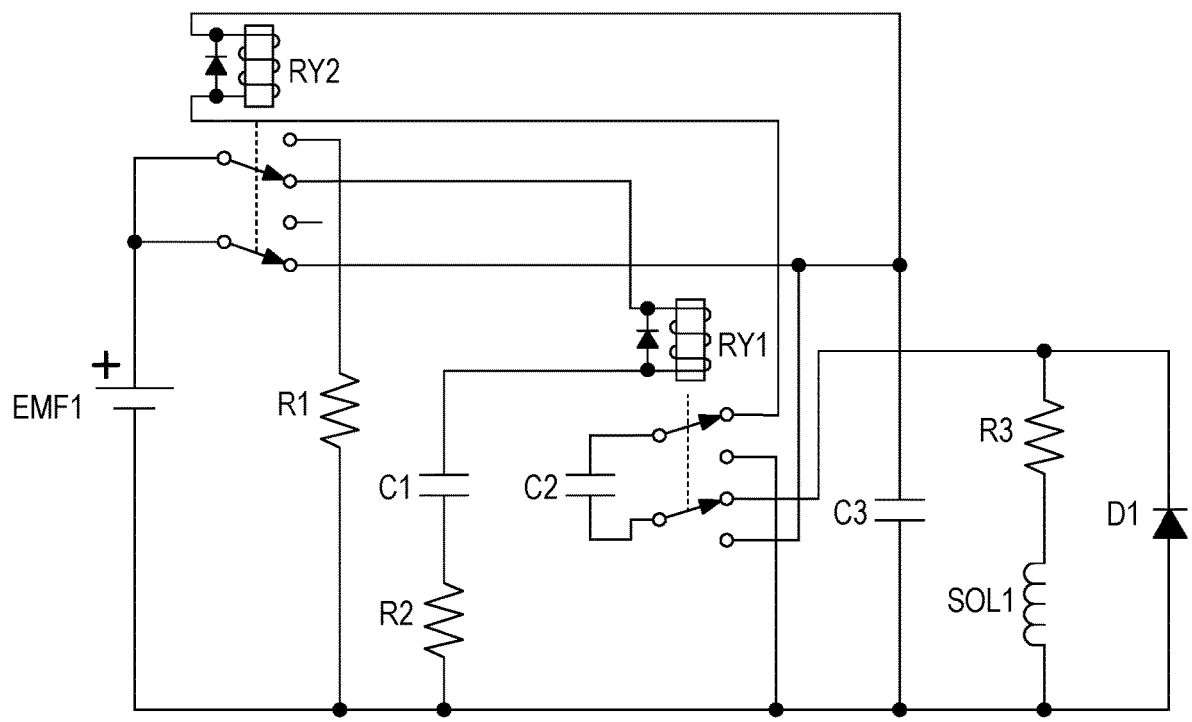
FIG. 5A depicts one embodiment of an energy storage component and a control circuit of an actuator control of a self-acting, anti-tip device, in accordance with one or more aspects of the present invention.

FIG. 5A depicts one embodiment of an actuator control circuit, in accordance with one or more aspects of the present invention. The actuator control circuit is shown in an initial (or resting) state, with the product not currently being moved. Note that the control circuit of FIG. 5A is one embodiment only, and that there are any number of circuit implementations which could be used to transfer energy generated within the inductive coil wire to the actuator. In the depicted circuit, the inductive coil is represented as source EMF1, and two double-pull relays RY1, RY2 are shown in their resting states. If the product is not in motion, EMF1 will equal zero, and the anti-tip mechanism (e.g., outriggers) remain in their resting, retracted state (in one or more embodiments described herein). Any stored charge in capacitor C1 can discharge through resister R2, and any energy stored in capacitor C2 and C3 can discharge through resistor R3. The actuator can be a solenoid actuator, which is represented in the circuit by inductor SOL1. Resister R3 can dampen the oscillating effect between the capacitors and the inductor in the solenoid such that the relay RY2 does not receive enough current to toggle its associated switches.

Figure 5B:
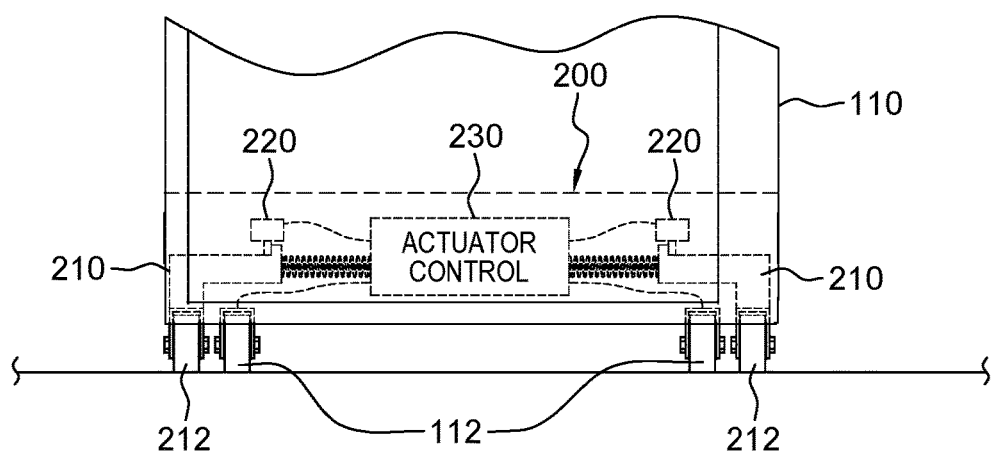
FIG. 5B depicts the product and device assembly of FIG. 2A, with the anti-tip mechanism(s) shown in the retracted state based on the control circuit state of FIG. 5A, in accordance with one or more aspects of the present invention.

FIG. 5B depicts the self-acting device 200 of FIG. 2A, with the anti-tip mechanism(s) 210 shown in retracted state, as retained by the actuators 220 until engaged by actuator control 230, which as noted, could be implemented with a control circuit embodiment such as described above in connection with FIG. 5A.

Figure 5C:
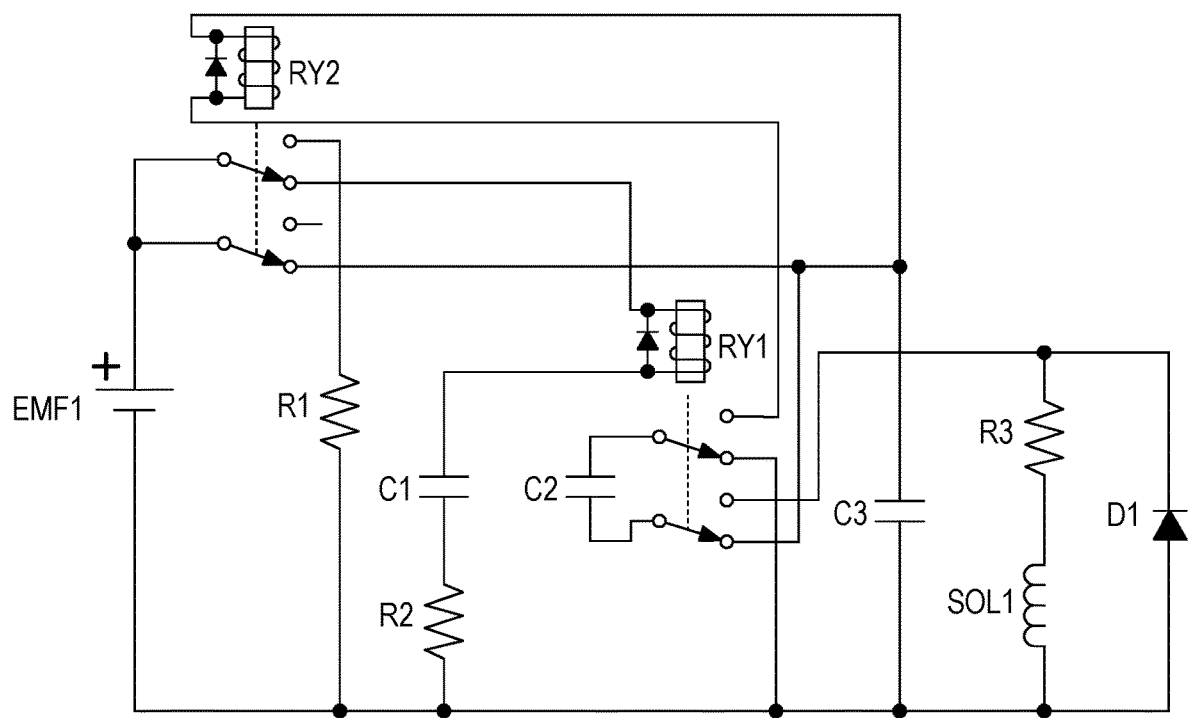
FIG. 5C depicts the energy storage component and control circuit of FIG. 5A, with the product being moved, resulting in voltage being generated, and showing the effect on the energy storage component and control circuit, in accordance with one or more aspects of the present invention.

In FIG. 5C, the control circuit of FIG. 5A is shown with the product in motion, such that with EMF1 is greater than 0 V. In this case, a current is induced that causes relay RY1 to change state of its associated switches, as shown in FIG. 5C, resulting in the capacitors C1, C2 and C3 charging in parallel due to the relay positions. There is no current in the solenoid, so the anti-tip mechanisms remain in their retracted state. As capacitor C1 charges, current through that path will decrease as the voltage difference between EMF1 and C1 decreases, since capacitor C1 is storing energy (as the energy storing component in the embodiment depicted). At a certain point, capacitor C1 will be fully charged, with the voltage at C1 equaling the voltage generated at EMF1. At this point, there is no current in relay RY1, and the relay closes, resulting in the circuit switching to the configuration shown in FIG. 5D.

Figure 5D:
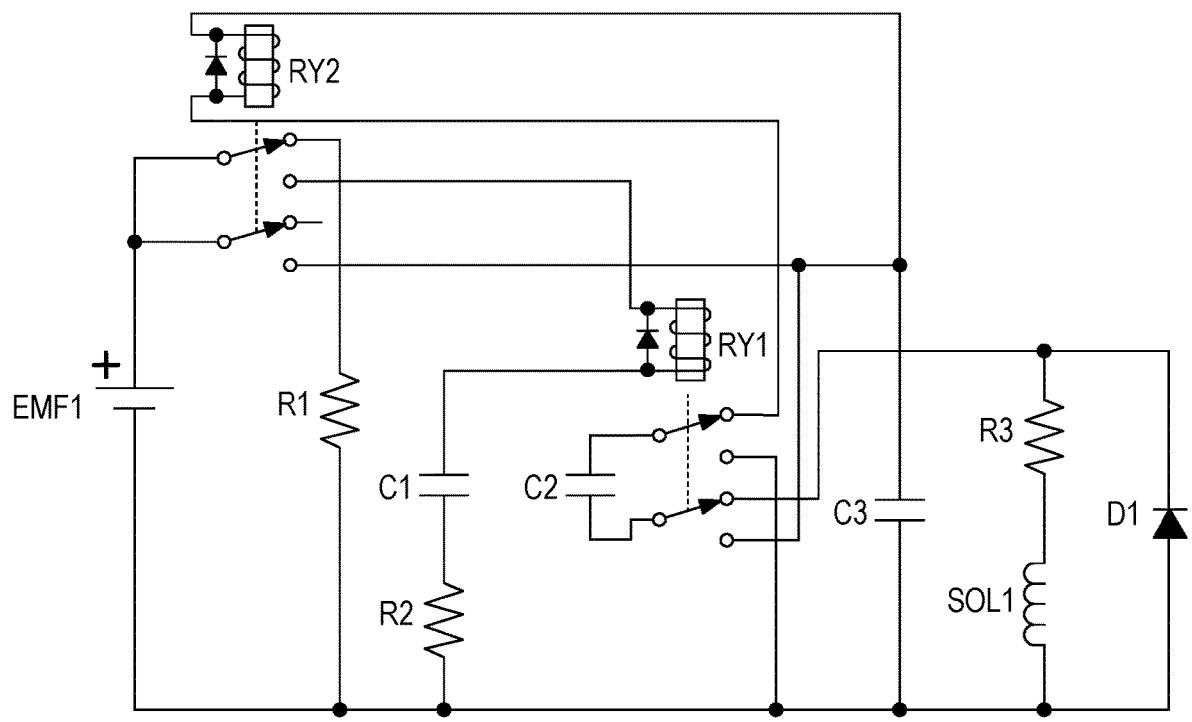
FIG. 5D depicts the control circuit of FIG. 5C, with sufficient energy being stored to signal the actuator(s) to facilitate transitioning the anti-tip mechanism(s) from retracted state to extended state, in accordance with one or more aspects of the present invention.
Figure 5E:
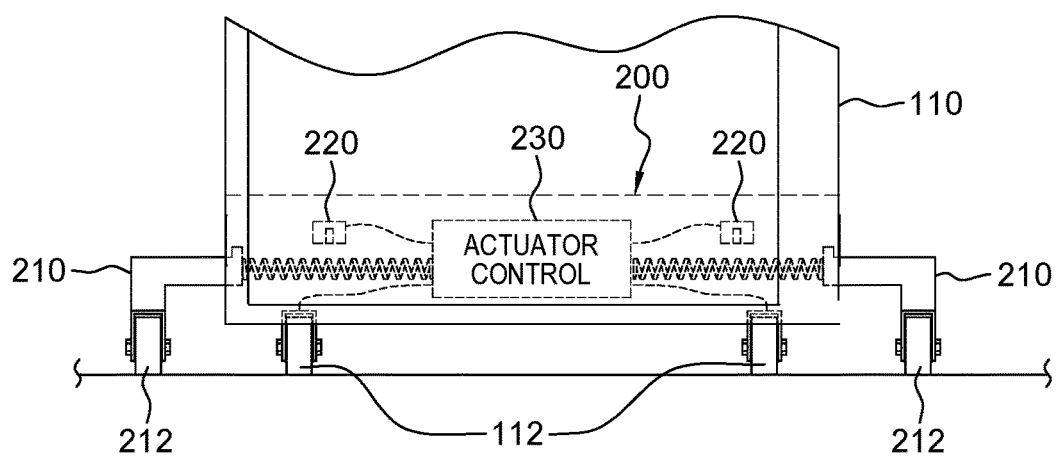
FIG. 5E depicts the product and device assembly of FIG. 5B, with the anti-tip mechanism(s) triggered to the extended state based on the control circuit state of FIG. 5D, in accordance with one or more aspects of the present invention.
Figure 5F:
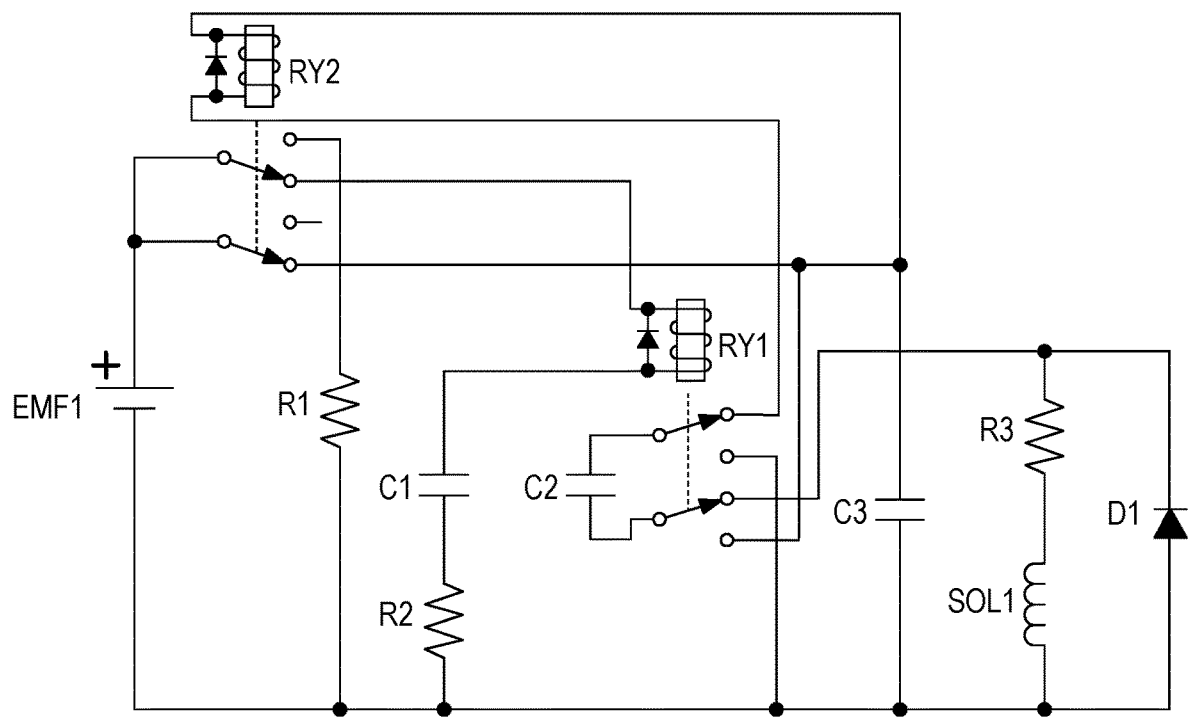
FIG. 5F depicts the energy storage component and control circuit of FIG. 5D, with the control circuit returned to its initial state, in accordance with one or more aspects of the present invention.

In FIG. 5D, when capacitor C1 is charged, current stops flowing through relay RY1, causing the relay switches to return to their rest positions of FIG. 5A. Capacitors C2 and C3 will now discharge in series through solenoid SOL1. Current will run through relay RY2, which changes the switch positions and allows any newly generated EMF to drop across resistor R1. Once engaged by the current flowing through SOL1, the solenoid releases, in one or more embodiments, the spring-loaded outriggers, allowing the outriggers to transition to their extended state or position. In this configuration, capacitor C1 discharges through resistor R2, and capacitors C2 and C3 can discharge through resistor R3. In one or more embodiments, engaging solenoid SOL1 as described herein results in the solenoid actuator facilitating transitioning of the anti-tip mechanism(s) (e.g., out-wardly-biased outriggers) to the extended state. For instance, engaging the solenoid could result in a retraction of one or more pins holding the outwardly-biased outriggers in retracted position, allowing the spring-biasing of the outriggers to extend the outriggers automatically, as shown in FIG. 5E.

Once capacitors C2 and C3 discharge, no current will run through relay RY2, and its associated switches will return to their rest positions. If the product is still being moved across the floor, the process described above repeats, but engaging the solenoid would not affect the anti-tip mechanisms since the anti-tip mechanisms are already in extended state. In this regard, note that solenoid SOL1 also returns to its rest position due to the fact that the current is no longer flowing. The outriggers have already extended in this example so that the solenoid is no longer holding them back. The circuit is then back at its initial state, shown in FIG. 5F, which is the same as the state shown in FIG. 5A. Once the product has been moved to its new location, the outriggers (or anti-tip mechanism) can be manually pushed back into place, with the product at its final position. As noted above, an optional override switch can be provided, for instance, above EMF1 in the circuit, so that if the product needs to be placed near other objects that interfere with the outriggers, the mover could override the self-acting aspect of the device. In another embodiment, after a mover has manually pushed the outriggers back in, the time in which the capacitors take to charge may be long enough such that the mover can maneuver the product near other objects that interfere (or would have interfered) with the extended outriggers, that is, before the outriggers extend.

Note that, in another embodiment, the control circuit can be designed to generate a sufficient voltage with an average walking speed to engage the actuator(s). If a slower pace is employed, then the control circuit can be designed so as not to engage the solenoid, such as when the product is being slowly moved into place between two existing computer racks. The circuit could intentionally be designed with this feature when moving at a slower pace due to the better stability and smaller likelihood of a tip over event when moving and/or turning at the slower pace.

Figure 6:
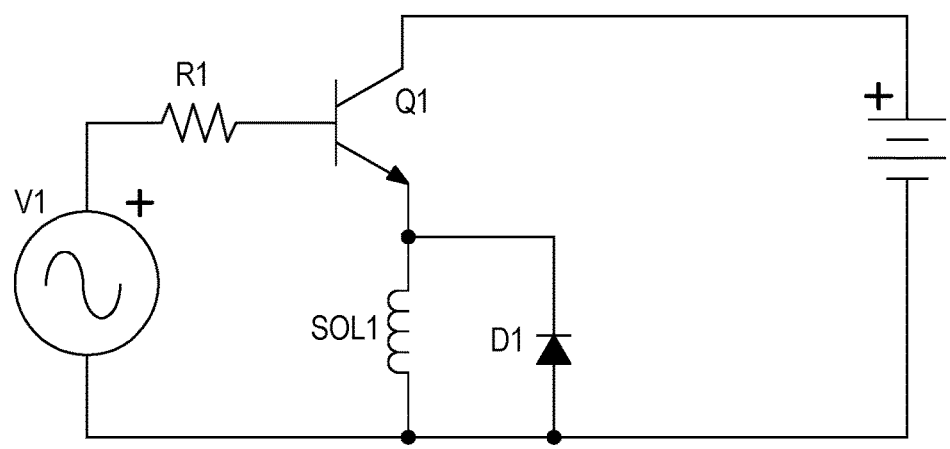
FIG. 6 depicts an alternate embodiment of an actuator control for signaling an actuator to facilitate transitioning the anti-tip mechanism(s) from retracted state to extended state, in accordance with one or more aspects of the present invention.

FIG. 6 depicts an alternate embodiment of an actuator control, where voltage generated at the inductive coil, herein V1, is used to switch on a transistor Q1. When transistor Q1 is switched on, current can flow from a battery through the solenoid actuator SOL1 to, for instance, release or retract the pin holding the respective anti-tip mechanisms in place, allowing the anti-tip mechanism(s) to automatically transition from the retracted state to the extended state, which assumes that the mechanisms are spring-biased outward. The battery is only switched on while the product is in motion, thus preventing draining of the battery when the self-acting device is not in use. A low-leakage battery could be used in this implementation, and/or if desired, a rechargeable battery could be used that could be charged by the product itself when the product is operational.

Figure 7:
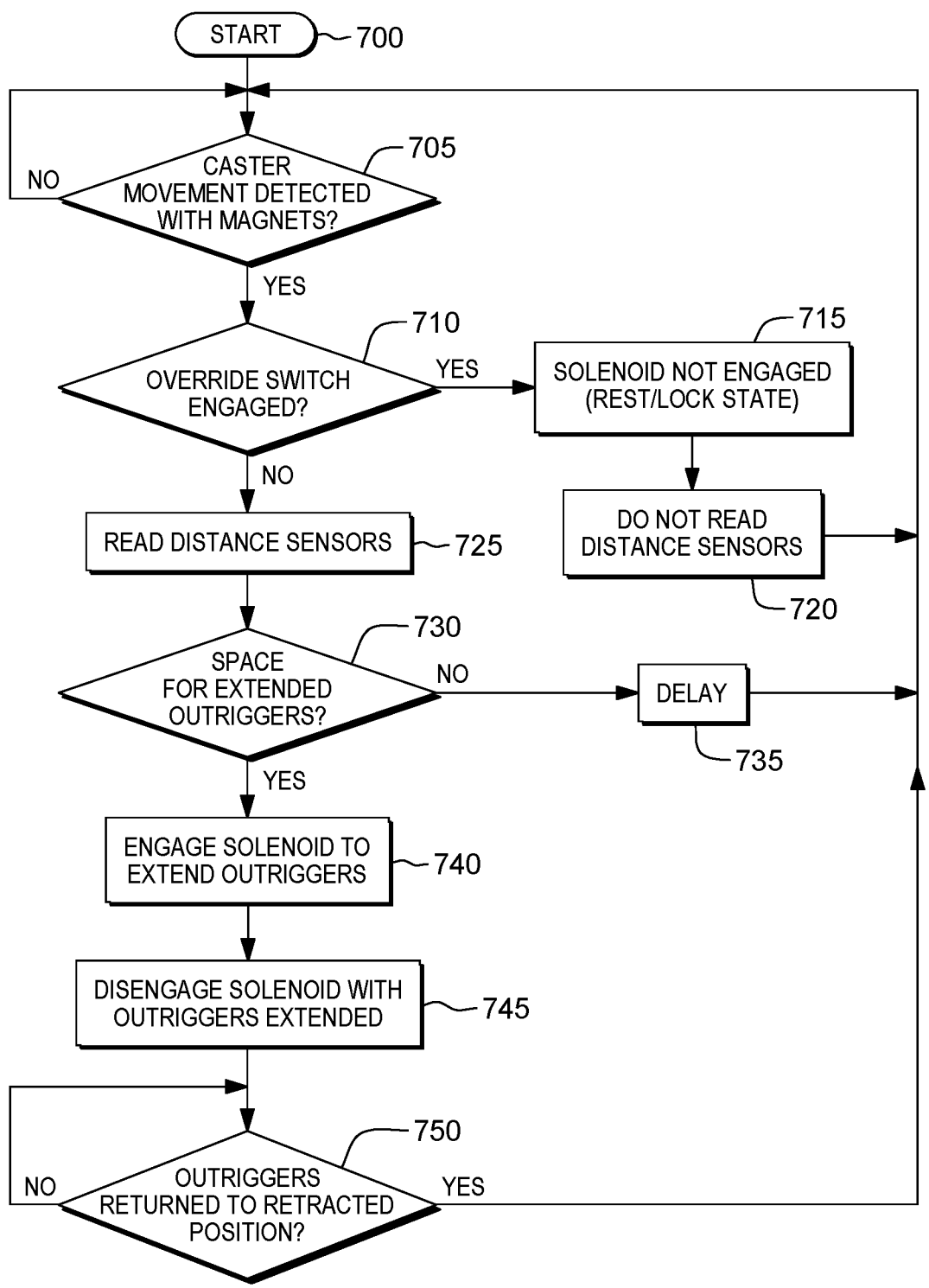
FIG. 7 depicts a further embodiment of actuator control processing for signaling a solenoid actuator to facilitate transitioning the anti-tip mechanism(s) from retracted state to extended state, in accordance with one or more aspects of the present invention.

FIG. 7 depicts another embodiment of an actuator control process which assumes, for instance, that the actuator control includes a battery and a processing circuit or microcontroller to detect movement of the product, and engagement of the anti-tip mechanism(s). The battery source could be an integrated battery feature of the product, or a separate battery, intended only for powering the self-acting device. If a separate battery is used, it could be charged via wheel movement, or from the product itself when the product is operational. Ultra-low power sensors, solenoids and processing circuitry could be used to extend the battery life.

Additionally, or alternatively, a sensor, for instance, a motion sensor, could be used instead of permanent magnets and an inductive coil sensing caster motion, as in the embodiments described above. Further, motors could be used to extend and retract the anti-tip mechanisms instead of spring-loaded structures held in place by a solenoid, as described in embodiments above.

The processing of FIG. 7 starts 700 with detecting caster movement with magnets, or other motion sensors, 705. Processing determines whether an associated override switch has been engaged 710. If so, then the solenoid is not engaged, remaining in a rest or lock state 715, and distance sensors are not read to determine whether there is sufficient distance to transition the anti-tip mechanism(s) to the extended state 720. Assuming that the override switch is not engaged, then the distance sensors are read 725 to determine, in one or more embodiments, whether there is sufficient space to allow the anti-tip mechanisms to transition from retracted state to extended state. If space is insufficient to extend the outriggers 730, then action is delayed 735, and processing determines whether the product is still in motion 705. If there is sufficient space for the anti-tip mechanisms to transition to the extended state, one or more solenoids are engaged to facilitate extending the outriggers 740. Once extended, the solenoid(s) is disengaged 745. Processing can then determine whether one or more of the anti-tip mechanisms or outriggers have been manually returned to the retracted state or position 750. If so, then the process returns to determine whether the product is in motion.

Those skilled in the art will note from the discussion above that various self-acting, anti-tip devices and methods are provided herein. In one or more embodiments, anti-tip mechanisms or outriggers are provided that extend out from under a product, such as a computer rack or frame. The outriggers are stored underneath the product, and extend laterally outward when the product is moved. Power to extend the outriggers can be generated by magnetic induction inducing a voltage in an inductive coil located between, for instance, a set of first permanent magnets coupled to the product casters to rotate with the casters when the product is moved, and a set of second permanent magnets that are stationary relative to the casters, but in close proximity. In these implementations, rotation of the casters is essentially turned into a generator that provides power to control automated extension of the outriggers or anti-tip mechanisms when the product is moved across a surface.

Figure 8:
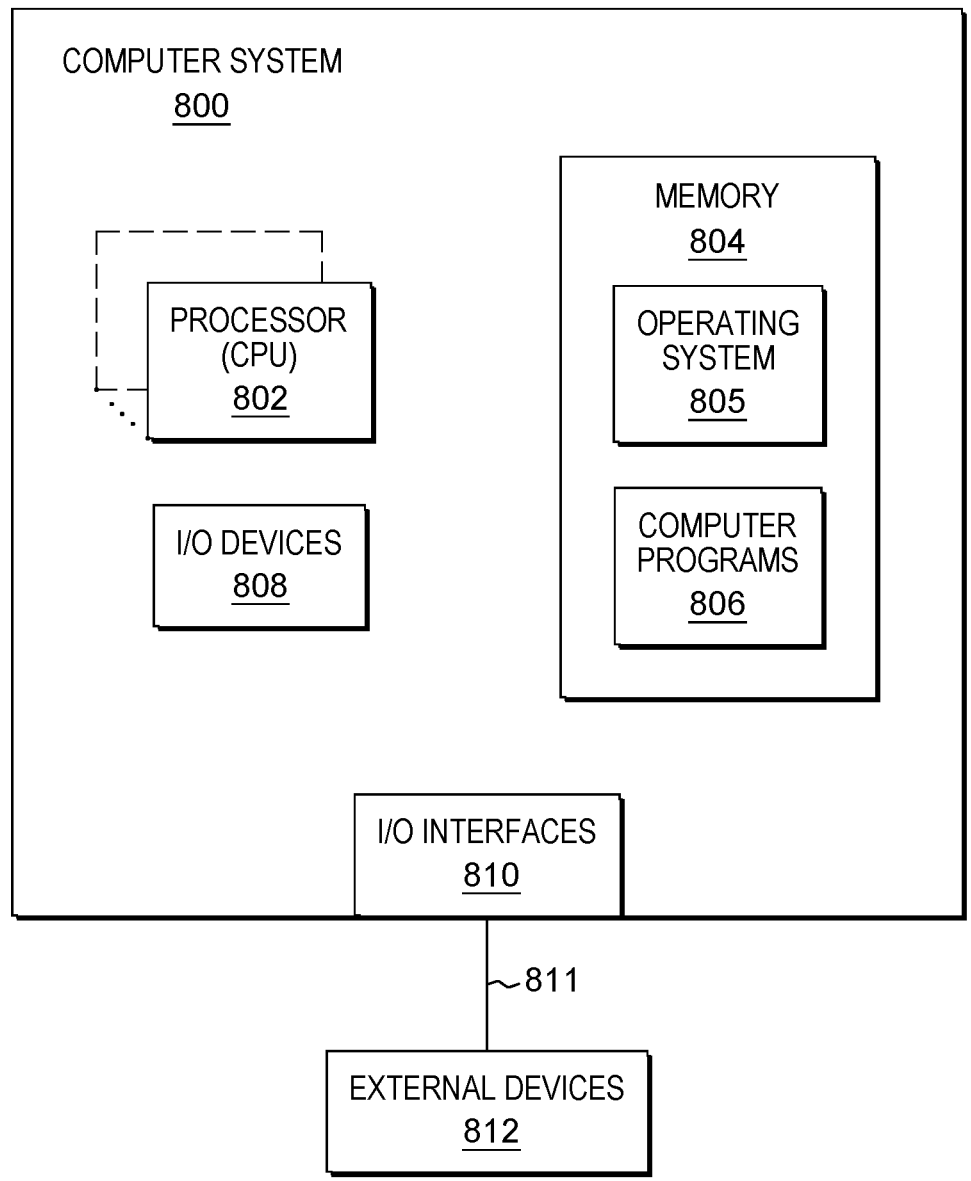
FIG. 8 depicts one example of a computer environment to incorporate or facilitate one or more aspects of the present invention.

One or more aspects of the movement detecting or actuator control of the anti-tip mechanism(s) can be performed by, implemented in association with, or otherwise facilitated by a computer system, one embodiment of which is depicted in FIG. 8. A computer system can be based on one of various system architectures and/or instruction set architectures, such as those offered by International Business Machines Corporation (Armonk, N.Y., USA), Intel Corporation (Santa Clara, Calif., USA) or ARM Holdings PLC (Cambridge, England, United Kingdom), as examples.

FIG. 8 shows a computer system 800 in communication with external device(s) 812. Computer system 800 includes one or more processor(s) 802, for instance, central processing unit(s) (CPUs). A processor can include functional components used in the execution of instructions, such as functional components that fetch program instructions from locations such as cache or main memory, decode program instructions, execute program instructions, access memory for instruction execution, and write results of the executed instructions. A processor 802 can include register(s) to be used by one or more of the functional components. Computer system 800 also includes memory 804, input/output (I/O) devices 808, and I/O interfaces 810, which can be coupled to processor(s) 802 and each other via one or more busses and/or other connections. Bus connections represent one or more of any of several types of bus structures, including a memory bus or memory controller, a peripheral bus, and a processor or local bus using any of a variety of bus architectures known in the art.

Memory 804 can be or include main or system memory (e.g., random access memory) used in the execution of program instructions, a storage device(s) such as hard drive(s), flash media or optical media as examples, and/or cache memory, as examples. Memory 804 can include, for instance, a cache, such as a shared cache, which can be coupled to local caches (examples include L1 cache, L2 cache, etc.) of processor(s) 802. Additionally, memory 804 can be or include at least one computer program product having a set (e.g., at least one) of program modules, instructions, code or the like that is/are configured to carry out the functions of various control aspects described herein when executed by one or more processors.

Memory 804 can store an operating system 805 and other computer programs 806, such as one or more computer programs/applications that execute to perform aspects described herein. Specifically, program/applications can include computer readable program instructions that can be configured to carry out functions of embodiments of aspects described herein.

Examples of I/O devices 808 include but are not limited to accelerometers, magnetometers, and/or other sensor devices coupled to, for instance, sense motion, etc. An I/O device can be incorporated into the computer system as shown, though in some embodiments an I/O device can be regarded as an external device 812 coupled to the computer system through one or more I/O interfaces 810.

Computer system 800 can communicate with one or more external devices 812 via one or more I/O interfaces 810. Example external devices include any device that enables computer system 800 to communicate with one or more other devices, such as an anti-tip mechanism described herein. A communication between I/O interfaces 810 and external devices 812 can occur across wired and/or wireless communication link(s) 811, such as Ethernet-based wired or wireless connections. Example wireless connections include cellular, Wi-Fi, Bluetooth®, proximity-based, near field, or other types of wireless connections. More generally, communication link(s) 811 can be any appropriate wireless and/or wired communication link(s) for communicating data. Computer system 800 can take any of various forms, well known examples of which include, but are not limited to, personal computer (PC) system(s), server computer system(s), laptop(s), tablet(s), multiprocessor system(s), multiprocessor-based system(s), etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A device for preventing product tip over, the device comprising:
   an anti-tip mechanism coupled to the product to facilitate preventing tip over thereof when in an extended state;
   an actuator operatively coupled to the anti-tip mechanism to control transition of the anti-tip mechanism from a retracted state to the extended state; and
   an actuator control comprising one or more motion sensors for sensing movement of the product across a floor, the actuator control signaling the actuator to facilitate transition of the anti-tip mechanism from the retracted state to the extended state based on the actuator control detecting movement of the product across the floor.

2. The device of claim 1, wherein the product sits on casters, and the actuator control comprises:
   at least one permanent magnet coupled to rotate with, a caster of the casters; and
   an inductive coil associated with the product and positioned such that rotation of the caster with the at least one permanent magnet induces an electromotive force (EMF) on the inductive coil to generate a voltage, the voltage causing the actuator control to signal the actuator to facilitate transitioning the anti-tip mechanism from the retracted state to the extended state.

3. The device of claim 2, wherein the at least one permanent magnet comprises at least one first permanent magnet, and the device further comprises at least one second permanent magnet fixedly positioned on the product separate from the caster, the inductive coil being located between the caster with the at least one first permanent magnet coupled to rotate therewith and the at least one second permanent magnet fixedly positioned separate from the caster.

4. The device of claim 2, wherein the actuator control comprises multiple permanent magnets coupled to rotate with the caster, the at least one permanent magnet being at least one permanent magnet of the multiple permanent magnets.

5. The device of claim 4, wherein adjacent permanent magnets of the multiple permanent magnets coupled to rotate with the caster are oriented with opposite polarities closer to a periphery of the caster.

6. The device of claim 2, wherein the actuator comprises a solenoid actuator, and the actuator control further comprises:
   an energy storage component electrically coupled to the inductive coil; and
   a circuit coupled to the energy storage component to signal the solenoid actuator to facilitate transitioning the anti-tip mechanism from the retracted state to the extended state with voltage in the energy storage component reaching a set transition threshold.

7. The device of claim 6, wherein the circuit comprises one or more relay components.

8. The device of claim 6, wherein the anti-tip mechanism comprises at least one spring-loaded outrigger, and the solenoid actuator retains the at least one spring-loaded outrigger in the retracted state until engaged by the voltage in the energy storage component of the actuator control reaching the transition threshold, and once engaged, the solenoid actuator moves to allow the at least one spring-loaded outrigger to transition to the extended state.

9. The device of claim 2, wherein the actuator comprises a solenoid actuator, and the actuator control applies the voltage to the solenoid actuator to engage the solenoid actuator to facilitate transitioning the anti-tip mechanism to the extended state to prevent product tip over.

10. The device of claim 2, wherein the actuator control comprises a battery and a transistor coupled to the actuator, the voltage causing the transistor to switch on, allowing current to flow from the battery to the actuator to facilitate transitioning the anti-tip mechanism from the retracted state to the extended state.

11. The device of claim 1, wherein the actuator control further comprises a distance sensor to confirm there is sufficient space to extend the anti-tip mechanism before signaling the actuator to facilitate transitioning the anti-tip mechanism from the retracted state to the extended state based on the detecting movement of the product across the floor.

12. The device of claim 1, wherein the actuator control comprises an override switch to selectively prevent the actuator control from signaling the actuator to transition the anti-tip mechanism from the retracted state to the extended state based on detecting movement of the product across the floor.

13. A device for preventing product tip over, the device comprising:
   an anti-tip mechanism coupled to the product to facilitate preventing tip over thereof when in an extended state, the anti-tip mechanism comprising at least one outwardly-biased outrigger;
   an actuator operatively coupled to the anti-tip mechanism to facilitate transition of the anti-tip mechanism from a retracted state to the extended state; and
   an actuator control to signal the actuator to facilitate transition of the anti-tip mechanism from the retracted state to the extended state based on the actuator control detecting movement of the product across a floor, the signal being based on the actuator control detecting rotation of a caster of multiple casters upon which the product rests.

14. The device of claim 13, wherein the actuator control comprises:
   at least one permanent magnet coupled to rotate with the caster; and an inductive coil associated with the product and positioned such that rotation of the caster with the at least one permanent magnet induces an electromotive force (EMF) on the inductive coil to generate a voltage, the voltage causing the actuator control to signal the actuator to facilitate transitioning the anti-tip mechanism from the retracted state to the extended state.

15. The device of claim 14, wherein the at least one permanent magnet comprises at least one first permanent magnet, and the device further comprises at least one second permanent magnet fixedly positioned on the product separate from the caster, with the inductive coil being located between the caster with the at least one first permanent magnet coupled to rotate therewith and the at least one second permanent magnet fixedly positioned separate from the caster.

16. The device of claim 14, wherein the actuator comprises a solenoid actuator, and the actuator control further comprises:
   an energy storage component electrically coupled to the inductive coil; and
   a circuit coupled to the energy storage component to signal the solenoid actuator to facilitate transitioning the anti-tip mechanism from the retracted state to the extended state when voltage in the energy storage component reaches a set transition threshold.

17. The device of claim 14, wherein the actuator control comprises a battery and a transistor coupled to the actuator, the voltage causing the transistor to switch on, allowing current to flow from the battery to the actuator to facilitate transitioning the anti-tip mechanism from the retracted state to the extended state.

18. A method of facilitating preventing product tip over, the method comprising:
   coupling an anti-tip mechanism to a product to facilitate preventing tip over of the product, the anti-tip mechanism having a retracted state and an extended state;
   operatively coupling an actuator to the anti-tip mechanism to control transitioning the anti-tip mechanism from the retracted state to the extended state; and
   providing an actuator control comprising one or more motion sensors for sensing movement of the product across a floor, the actuator control signaling the actuator to facilitate transition of the anti-tip mechanism from the retracted state to the extended state based on the actuator control detecting movement of the product across the floor.

19. The method of claim 18, wherein the product sits on casters, and providing the actuator control includes:
   coupling at least one permanent magnet to rotate with a caster of the casters; and
   positioning an inductive coil within the product such that rotation of the caster with the at least one permanent magnet induces an electromotive force (EMF) on the inductive coil to generate a voltage, the voltage causing the actuator control to signal the actuator to facilitate transitioning the anti-tip mechanism from the retracted state to the extended state.

* * * * *